United States Patent
Bazylenko et al.

[11] Patent Number: 6,154,582
[45] Date of Patent: Nov. 28, 2000

[54] FABRICATION METHOD OF MAKING SILICA-BASED OPTICAL DEVICES AND OPTO-ELECTRONIC DEVICES

[75] Inventors: Michael V Bazylenko, Forestville; Mark Gross, Seaforth; Eric Gauja, Peakhurst; Pak Lim Chu, Bardwell Park, all of Australia

[73] Assignee: Unisearch Limited, Sydney, Australia

[21] Appl. No.: 08/945,041

[22] PCT Filed: Dec. 1, 1995

[86] PCT No.: PCT/AU95/00811

§ 371 Date: Feb. 12, 1998

§ 102(e) Date: Feb. 12, 1998

[87] PCT Pub. No.: WO96/33429

PCT Pub. Date: Oct. 24, 1996

[30] Foreign Application Priority Data

Apr. 21, 1995 [AU] Australia .................. PN2580

[51] Int. Cl.[7] .............. G02B 6/12; H01L 21/70; C03B 37/023
[52] U.S. Cl. .............. 385/14; 385/15; 385/49; 385/129; 385/130; 385/131; 385/141; 437/51; 437/130; 437/131; 65/385; 65/391; 65/413
[58] Field of Search ............... 385/14, 15, 49, 385/129, 130, 131, 141; 65/385, 391, 397, 413, 436; 437/51, 129, 130, 131

[56] References Cited

U.S. PATENT DOCUMENTS

| | | | |
|---|---|---|---|
| 4,747,649 | 5/1988 | Heinen et al. | 385/14 X |
| 4,835,575 | 5/1989 | Plihal | 385/14 X |
| 4,966,430 | 10/1990 | Weidel | 385/14 X |
| 4,969,712 | 11/1990 | Westwood et al. | 385/14 X |
| 5,059,475 | 10/1991 | Sun et al. | 428/195 |
| 5,253,319 | 10/1993 | Bhagavatula | 385/129 |
| 5,262,656 | 11/1993 | Blondeau et al. | 385/14 X |

FOREIGN PATENT DOCUMENTS

| | | | |
|---|---|---|---|
| 52901 | 6/1982 | European Pat. Off. | 385/14 X |
| 171615 | 2/1986 | European Pat. Off. | 385/14 X |
| 331338 | 9/1989 | European Pat. Off. | 385/14 X |
| 378112 | 7/1990 | European Pat. Off. | 385/14 X |
| 500102 | 8/1992 | European Pat. Off. | 385/14 X |
| 617301 | 9/1994 | European Pat. Off. | 385/14 X |
| 4002098 | 8/1990 | Germany | 385/14 X |
| 93 16403 | 8/1993 | WIPO | 385/14 X |

OTHER PUBLICATIONS

Syms, et al. "Reduction of propagation loss in silica–on–silicon channel waveguides formed by electron beam irradiation" Electronic Leters, Sep. 1, 1994, vol. 30, No. 18, (2pgs.).

Derwent Abstract Accession No. 95–119104/16, Class VO5, V07 JP 07041953, Feb. 10, 1995.

Derwent Abstract Accession No. 94–211764/26, Class V07, JP 06148445, Nov. 9, 1992.

Derwent Abstract Accession No. 88–017534/03, Class V07, JP 2279304, Dec. 4, 1987.

Derwent Abstract Accession No. 88–017533/03, Class V07, JP 2279303, Dec. 4, 1987.

*Primary Examiner*—Brian Healy
*Attorney, Agent, or Firm*—Ostrolenk, Faber, Gerb & Soffen, LLP

[57] ABSTRACT

The present invention relates to a method of fabricating optical devices and in particular to a method of fabricating integrated opto-electronic devices, and to an opto-electronic device. A plasma enhanced chemical vapor deposition process (PECVD) is used to deposit an optical device integrated in silicon onto an electronic device fabricated in silicon. Relatively low temperatures are utilized and, in order to reduce losses of a waveguide in the optical device in the wavelength range 1.50 to 1.53 $\mu$m, the deposition process is carried out in the absence of nitrogen. An optical device is disclosed which comprises an integrated construction incorporating an optical waveguide in silica and a photonic transducer in silicon.

17 Claims, 10 Drawing Sheets

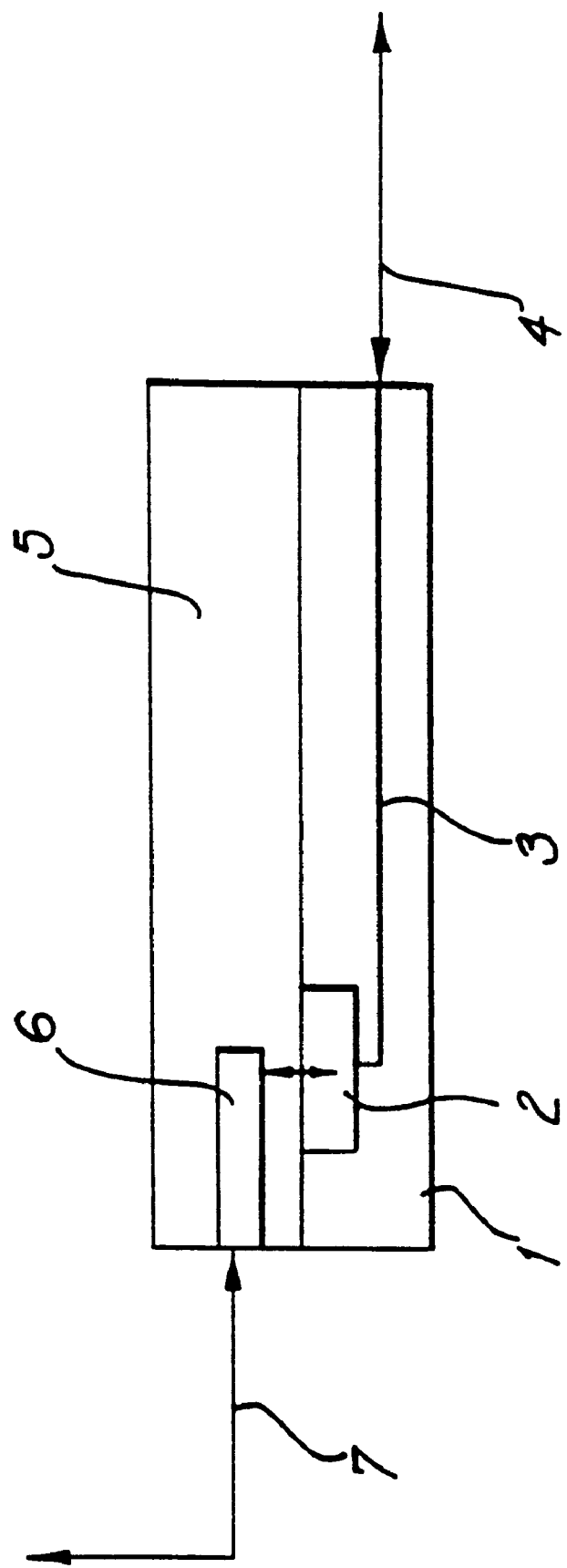

FABRICATION METHOD OF MAKING SILICA-BASED OPTICAL DEVICES AND OPTO-ELECTRONIC DEVICES

FIELD OF THE INVENTION

The present invention relates generally to a method of fabricating an integrated opto-electronic device and devices fabricated by the method, to a method of fabricating an optical device by a plasma enhanced chemical vapour deposition process, and, to low temperature fabrication of integrated opto-electronic devices, utilising a plasma enhanced chemical vapour deposition process.

BACKGROUND OF THE INVENTION

Processes and devices which merge silica optical devices with advanced silicon electronics in integrated form are desirable. This will enable, for example, "super chips" to be provided which interface between optical and electronic technologies.

To achieve this integration it is desirable to be able to produce devices which combine thin film waveguides, and/or other optical components, usually silica based, married to a semiconductor substrate containing an electronic device or devices, usually silicon based.

One problem to be overcome in the fabrication of such devices is development of low temperature deposition processes which would allow deposition of thin film waveguides directly on top of electronic devices in a semiconductor substrate, without damaging the electronic devices. Plasma enhanced chemical vapour deposition (PECVD) is an attractive option for such low temperature deposition processes. Over the years of commercial use in conventional VLSI fabrication it has proven to be reliable, clean and well matched to modern automated IC production.

Some work has been done on the PECVD fabrication of waveguides.

1. [K. Imoto and A. Hori: "High refractive index difference and low loss optical waveguide fabricated by low temperature processes", Electron. Lett., Vol. 29, 1993, pp. 1123–1124.]
2. [Franco Bruno, Massimo del Guidice, Roberto Recca, and Francesco Testa: "Plasma enhanced chemical vapour deposition of low-loss SiON optical waveguides at 1.5-$\mu$m wavelength", Appl. Opt., Vol. 30, 1991, pp. 4560–4564.]
3. [E. S. Bulat, M. Tabasky, B. Tweed, C. Herrick, S. Hapkin, N. J. Lewis, D. Obias, and T. Fitzgerald: "Fabrication of waveguides using low-temperature plasma processing techniques", J. Vac. Sci. Technol., Vol. A11, 1993, pp. 1268–1274.]
4. [Q. Lai, J. S. Gu, M. K. Smit, J. Schmid and H. Melchior: "Simple technologies for fabrication of low-loss silica waveguides:, Electron. Lett. Vol., 28, 1992, pp. 1000–1001.]
5. [G. Grand, J. P. Jadot, H. Danis, S. Valette, A. Fournier, A. M. Crouillet: "Low-loss PECVD silica channel waveguides for optical communications", Electron. Lett., Vol. 26, 1990, pp. 2135–2137.]
6. [K. Kapser, C. Wagner, and P. P. Deimel: "Rapid deposition of high-quality silicon-oxynitride waveguides", IEEE Trans. Phot. Techn. Lett., Vol 3, 1991, pp. 1096–1098.]

These prior art processes have utilised nitrogen as a refractive index increasing dopant and/or nitrous oxide as an oxidant for silane. Such waveguides suffer, however, from high (3 to 10 dB/cm) losses in the wavelength range 1.50 to 1.55 $\mu$m due to a large absorption peak in this region. These losses can only be reduced by annealing the fabricated device at temperatures around 1000° C., which would destroy any electronic circuits in an associated semiconductor substrate. These processes do not, therefore, allow production of practical integrated opto-electronic devices. Nitrous oxides has always been used in prior art processes as an oxidant for silane. This is because it gives better thickness uniformity and is able to be used under high pressures, so as to optimise productivity.

SUMMARY OF THE INVENTION

The present invention is, in part, based upon the belief that N—H bonds are mostly responsible for the large absorption in the 1.50 to 1.55 $\mu$m range.

From a first aspect, the present invention provides a method of fabricating an integrated opto-electronic arrangement, comprising an optical component fabricated in silica and an electronic component fabricated in a semiconductor substrate, the method comprising the step of forming the optical component by plasma enhanced chemical vapour deposition (PECVD) onto the semiconductor substrate. Preferably the PECVD is carried out in the absence of nitrogen and nitrogen containing source materials.

Nobody has before proposed the use of an oxidant which does not contain nitrogen. Nobody before has made any suggestion that the absence of nitrogen, together with a PECVD process for forming an optical device, would result in an improvement in the losses suffered in the wavelength range 1.50 to 1.55 micrometres.

Preferably, the PECVD process is carried out using oxygen as an oxidant for silane to form deposited silica and fluorine as a dopant to vary the refractive index of the deposited silica. Carbon tetrafluoride is preferably utilised as the source material for the flourine dopant.

Preferably, the semiconductor substrate is a silicon substrate.

Using this method, in preferred embodiments waveguide structures have been fabricated on a silicon wafer substrate at relatively low temperatures (low enough to ensure that any devices in the silicon wafer substrate will not be destroyed or damaged) and with a propagation loss in the waveguides of less than 0.2 dB/cm at the 1.50 to 1.55 $\mu$m wavelengths range. The method, in at least preferred embodiments, is therefore suitable for the manufacture of integrated opto-electronic devices.

Other standard fabrication processes (for example chemical etching) may be utilised with the method of the present invention if required in order to shape or form components of the integrated arrangement and as long as the temperatures utilised will not damage electronic and/or optoelectronic components in the semiconductor substrate.

A hollow cathode chamber arrangement is preferably employed for the PECVD process. In the preferred embodiment, a high plasma density hollow cathode deposition system is employed, incorporating two opposing rf powered (with respect to a grounded chamber) electrodes for producing a high density plasma between them due to an "electron mirror" effect.

7. [C. M. Horwitz, S. Boronkay, M. Gross and K. E. Davies: "Hollow cathode etching and deposition", J. Vac. Sci. Technol, Vol. A6, 1988, pp. 1837–1844.]

The disclosure of this paper is considered incorporated therein by reference.

Such a system has not previously been employed for PECVD of optical circuits. Where oxygen is used as the oxidant, pressures in the chamber should preferably be sufficiently low to suppress spontaneous reaction between silane and oxygen (e.g., preferably below 5 Pa).

The method discussed above is suitable, in at least preferred embodiments, for application in fabricating any type of device which combines optics with electronics in an integrated form.

In an alternative embodiment, the present invention also has advantageous application for the fabrication of any optical device or component, not just the formation of opto-electronic devices. The advantage of PECVD, and in particular the advantage of excluding nitrogen from the process to result in less loss at the 1.5 micrometre wavelength, results in a number of advantages for optical fabrication. In particular, fabrication is simpler because high temperature annealing is not necessary. High temperature annealing as such may cause additional problems, such as loss of photosensitivity effect (which is useful for UV-writing of Bragg gratings, for example), can result in change in the refractive index of the waveguide layers, film delamination from the substrate and a number of other problems.

From a further aspect, the present invention provides a method of fabricating an optical device on a substrate, comprising the step of forming an optical component by plasma enhances chemical vapour deposition (PECVD) onto the substrate, the PECVD being carried out in the absence of nitrogen and nitrogen containing source materials.

The method of this aspect of the invention may include any of the method steps discussed above, in relation to the previous aspect of the invention.

One device which it would be particularly useful to be able to fabricate is one which allows the coupling of the core of a waveguide onto a photo diode or allows the core of the waveguide to be coupled to a semiconductor electronic light source, such as a surface emitting laser. This would provide a convenient interface between optics and electronics. Present optical coupling to electronics relies on highly accurate positioning of an optical waveguide with respect to an electronic component. This is very difficult to do and, in operation, such a device only requires a slight movement in relative position of waveguide and electronic component to deleteriously affect operation. An integrated opto-electronic device providing waveguide coupling with electronic components would assist in overcoming these problems.

From a further aspect, the present invention provides an integrated opto-electronic device, comprising a multilayer silica structure fabricated on a semiconductor substrate, the silica structure incorporating a waveguide defining a light path and a reflector within the light path for steering light to or from an electro-optic transducer fabricated in the semiconductor substrate.

Preferably, but not essentially, the method discussed above in relation to the first aspect of the invention is employed to fabricate the opto-electronic device. The electro-optic transducer may be a surface emitting laser, for emitting light to the waveguide, or may be a photo-diode for receiving light from the waveguide.

In a preferred construction, the waveguide lies in a plane which runs substantially parallel to the surface of the semiconductor substrate. Light travels along the waveguide in a direction parallel to the surface of the semiconductor substrate and the reflector is arranged to direct the light downwards towards the semiconductor substrate or (where light is being produced by a laser on the surface of the semiconductor substrate) directs light from the semiconductor substrate into and along the waveguide. The reflector is preferably positioned to provide an angle of incidence to the light beam of 45°.

In one embodiment, the reflector is formed by first forming a step in the core, the step running at an angle (preferably 45°) to the longitudinal direction of the waveguide core, and then forming a reflector on the angled face of the step by depositing aluminium thereon. A number of novel fabrication techniques are utilised in the formation of the step, as will become clear from the description given herein of a preferred embodiment.

From yet a further aspect the present invention provides an integrated opto-electronic arrangement, comprising an optical component fabricated in silica and an electronic component fabricated in a semiconductor substrate.

From yet a further aspect, the present invention provides a method of fabricating an integrated opto-electronic device, comprising a multilayer silica structure fabricated on a semiconductor substrate, the silica structure comprising a waveguide defining a light path and a reflector within the light path for steering light to or from an electro-optic transducer fabricated in the semiconductor substrate, the method comprising the steps of, forming a waveguide core in a multilayer silica structure on a semiconductor substrate, forming an angled step in the waveguide core, and treating a surface of the step to form a reflector for steering light to the electro-optic transducer in the semiconductor substrate.

BRIEF DESCRIPTION OF THE DRAWINGS

Features and advantages of the present invention will become apparent from the following description of embodiments thereof, by way of example only, with reference to the accompanying drawings, in which:

FIG. 1 is a schematic diagram for illustrating the principle of integration of opto-electronic devices;

DETAILED DESCRIPTION OF THE INVENTION

Figure 1A:
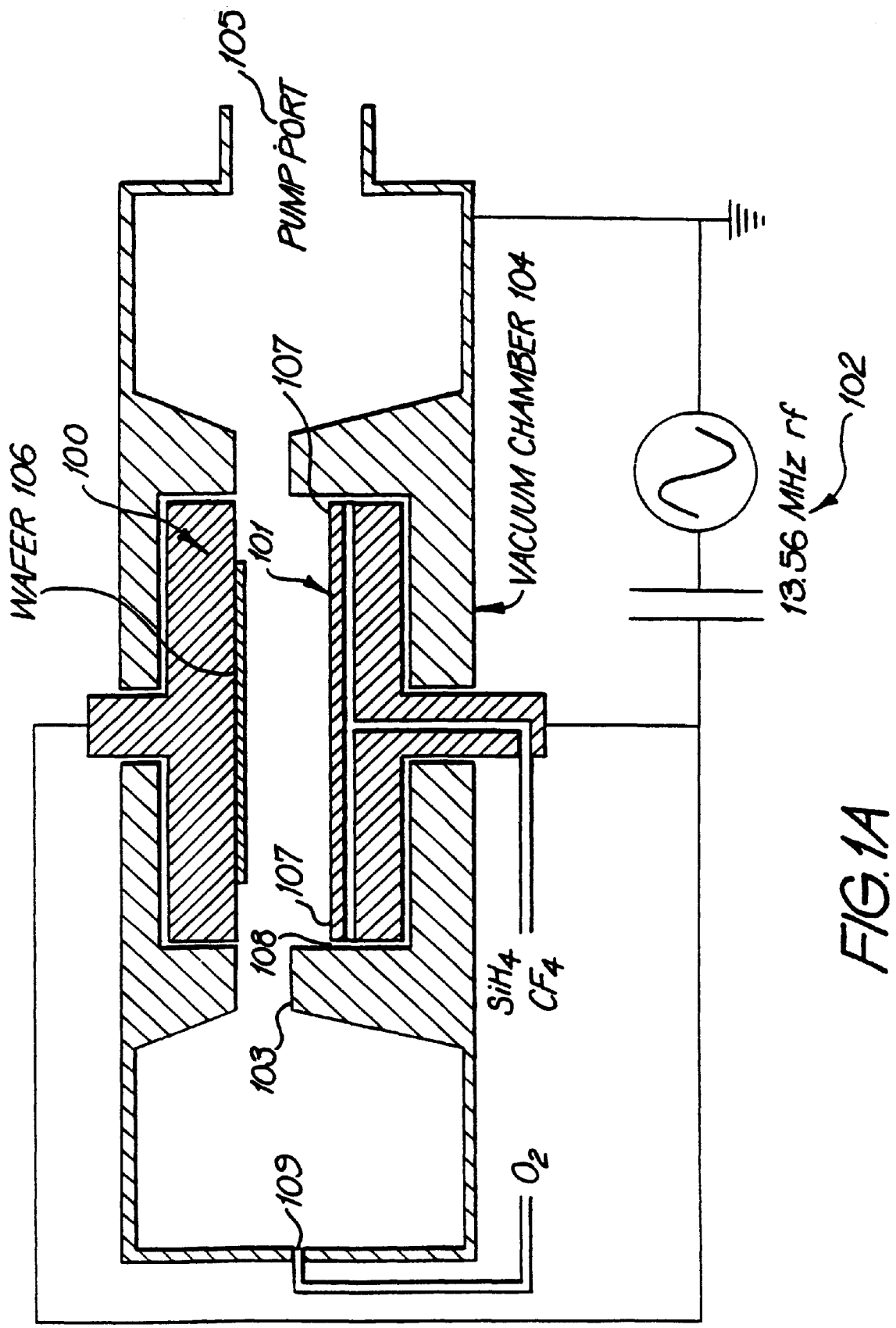
FIG. 1A is a cross section through a reactor chamber which may be used to carry out a method in accordance with an embodiment of the present invention.

FIG. 1 is a schematic diagram showing a theoretical integrated opto-electronic device. The device comprises a silicon substrate 1 in which an electro-optic transducer 2 is fabricated together with a conductive connection 3 which connects to a conductor 4 which may connect to an external circuit or device, e.g., computer (NB circuit or device may be fabricated in the same semiconductor substrate). The electro-optic transducer 2 may be a photo diode, surface emitting laser, or any other device which operates to couple light and electricity.

Fabricated on the semiconductor substrate 1 is a multi-layer silica structure 5 containing optical components 6, in this case a waveguide core 6 for guiding laser light. The core 6 operates to guide light between the transducer 2 and an optical arrangement indicated by reference numeral 7, which may be an optic fibre connecting to an optical system. Many silica based waveguide devices may be fabricated in the same multilayer silica structure, to perform optical signal processing before coupling to the substrate device, for example.

As discussed above, manufacture of integrated opto-electronic circuits of the type shown in FIG. 1 faces a number problems. The high temperature conventionally used to process silica to form optical circuits would damage or destroy any electronic components in a semiconductor substrate being integrated with the optical circuit. Low temperature PECVD processes for forming optical circuits have proved unsatisfactory, due to the existence of a high transmission loss in the wavelength range 1.50 to 1.55 $\mu$m. In the preferred embodiment of the present invention, we employ a PECVD process for the fabrication of an optical circuit in a multilayer silica structure onto a semiconductor substrate. Oxygen is used as the oxidising agent, in substitution for nitrous oxide as used in conventional parallel plate PECVD reactors. Fluorine is used as the refractive index varying dopant, the source material for fluorine being carbon tetrafluoride.

For the reactor, we employ a specially designed and built high plasma density hollow cathode deposition system. Such a system has been proposed for fabrication of semiconductor devices (see reference 7) but has not previously been proposed for PECVD of optical devices or integrated opto-electronic devices. Such a system is capable of delivering a relatively high deposition rate (2000 Å per minute) at pressure sufficiently low to suppress spontaneous reaction between silane and oxygen (i.e., pressures generally below 5 Pa).

A cross-section through an example device is shown in FIG. 1A. Two opposing aluminium electrodes 100, 101 are connected to a common 13.56 MHz rf power supply 102. The diameter of each electrode 100, 101 is 14 cm and the spacing between them is 3 cm. A conventional, low intensity diode discharge is generated between each of the electrodes and the grounded chamber, but between the two electrodes a very intense hollow cathode discharge region is created due to an "electric mirror" or "reflected electron" effect (see reference 7). The intensity of this hollow cathode discharge can be controlled by discharge confinement (8. K E Davis and C M Horwitz "diode and hollow cathode etching in a $CF_4$," J. Vac. Sci. Technol, A7 (4), 2705–2708, (1989)). The subject matter of reference 8 is considered to be incorporated herein by reference. In the present study a grounded confining ring 1.5 cm high 103 was used around the lower electrode 101.

The reactor further comprises a vacuum chamber wall 104, with pump port 105 leading to a vacuum pump. The substrate wafer 106 is supported on the upper electrode 100.

To prevent particle generation due to spontaneous reaction between silane and oxygen at the relatively high pressure in the gas-feed pipes, the two gasses are delivered to the reactor separately. Silane is supplied through a circumferential set of holes 107 in the gap 108 between the lower electrode 101 and the rounded chamber 104, while oxygen is delivered through a single hole 109 in the chamber 104 side wall. A circumferential geometry for oxygen delivery has been tested but no difference in the deposition uniformity was found, suggesting that it is entirely determined by the silane delivery. For doping, $CF_4$ is pre-mixed with silane before delivery.

The power level and pressure throughout the following examples was generally kept at 600 w and 2 Pa, respectively. The self-developed bias voltage on the two electrodes was in the range of 250 to 300 volts.

Please not that although this reaction chamber is preferred, other existing high plasma density sources capable of delivering high deposition rate at low pressures could be used with the present invention (e.g., Transformer Coupled Plasma, Electron Cyclotron Resonance, Helicon source and so on).

Figure 2:
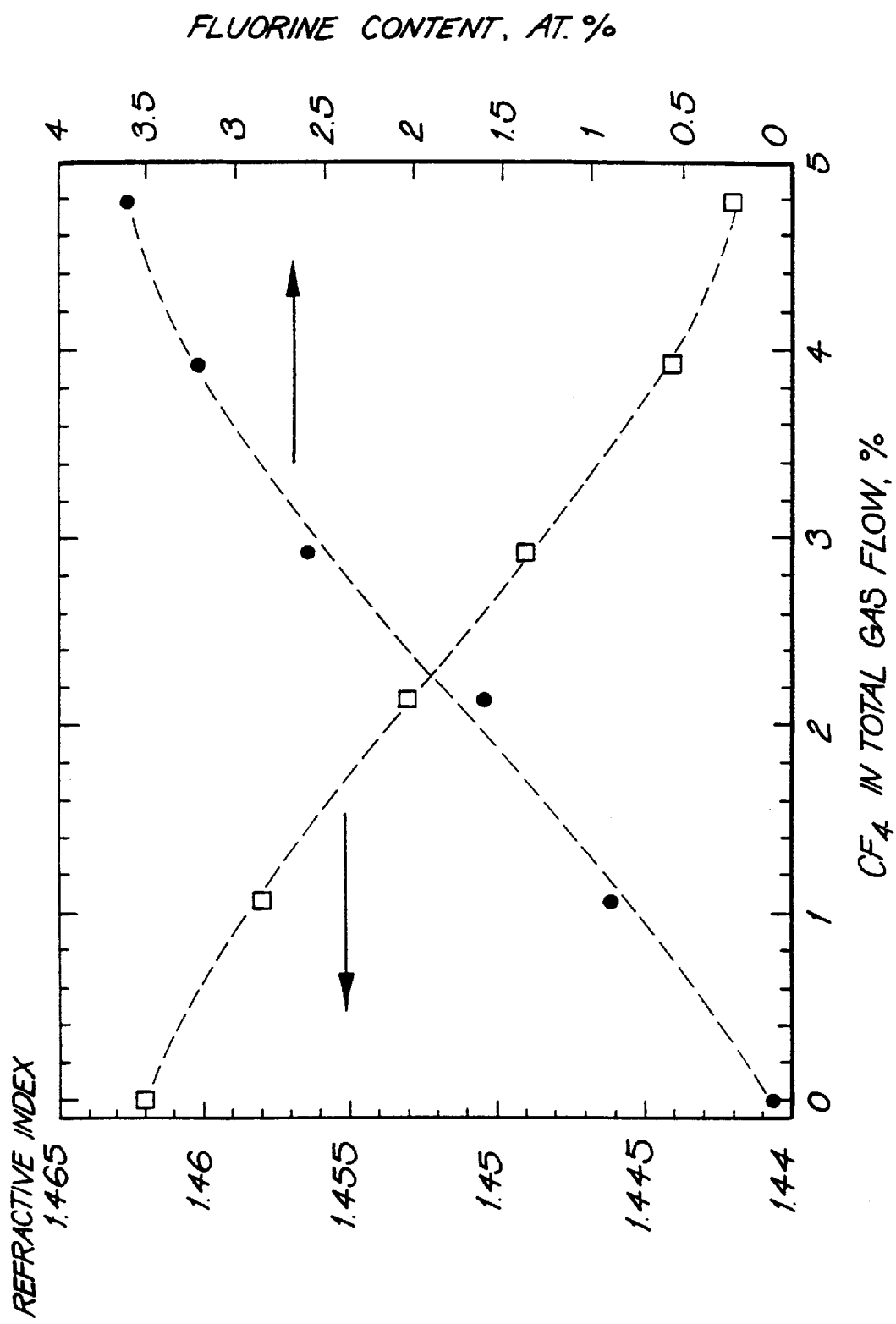
FIG. 2 is a graph to illustrate the dependence of the refractive index and fluorine content of deposited silica films in a PECVD process in accordance with the present invention, as a function of the $CF_4$ flow rate in the total gas flow.

FIG. 2 shows the dependence of the refractive index and fluorine content of the deposited silica films, as a function of the $CF_4$ flow rate in the total gas flow. The oxygen to silane flow rate ratio was fixed at 6:1. The refractive index was measured by the prism coupling method (at a wavelength of 0.6328 $\mu$m). It is seen that the refractive index decreases gradually, and almost linearly, with the $CF_4$ percentage in the total gas flow. This allows for accurate refractive index control with a possible index difference between the silica core and the fluorine doped buffer and cladding layers ranging from 0.004 to about 0.02 with a reproducibility within 0.001.

The fluorine and carbon content in the deposited films were determined by Wavelength Dispersive X-ray Spectroscopy (WDS). The fluorine content increases linearly with the $CF_4$ percentage in the total gas flow (FIG. 2) which agrees well with the observed change in the refractive index. At the same time no carbon above the sensitivitity of the WDS system (about 0.1 at %) was found in the deposited films. This is most likely the result of oxidation of the carbon to form volatile CO or $CO_2$. The absence of carbon in the deposited films confirms that fluorine incorporation is the only mechanism by which the refractive index is controlled.

Figure 3:
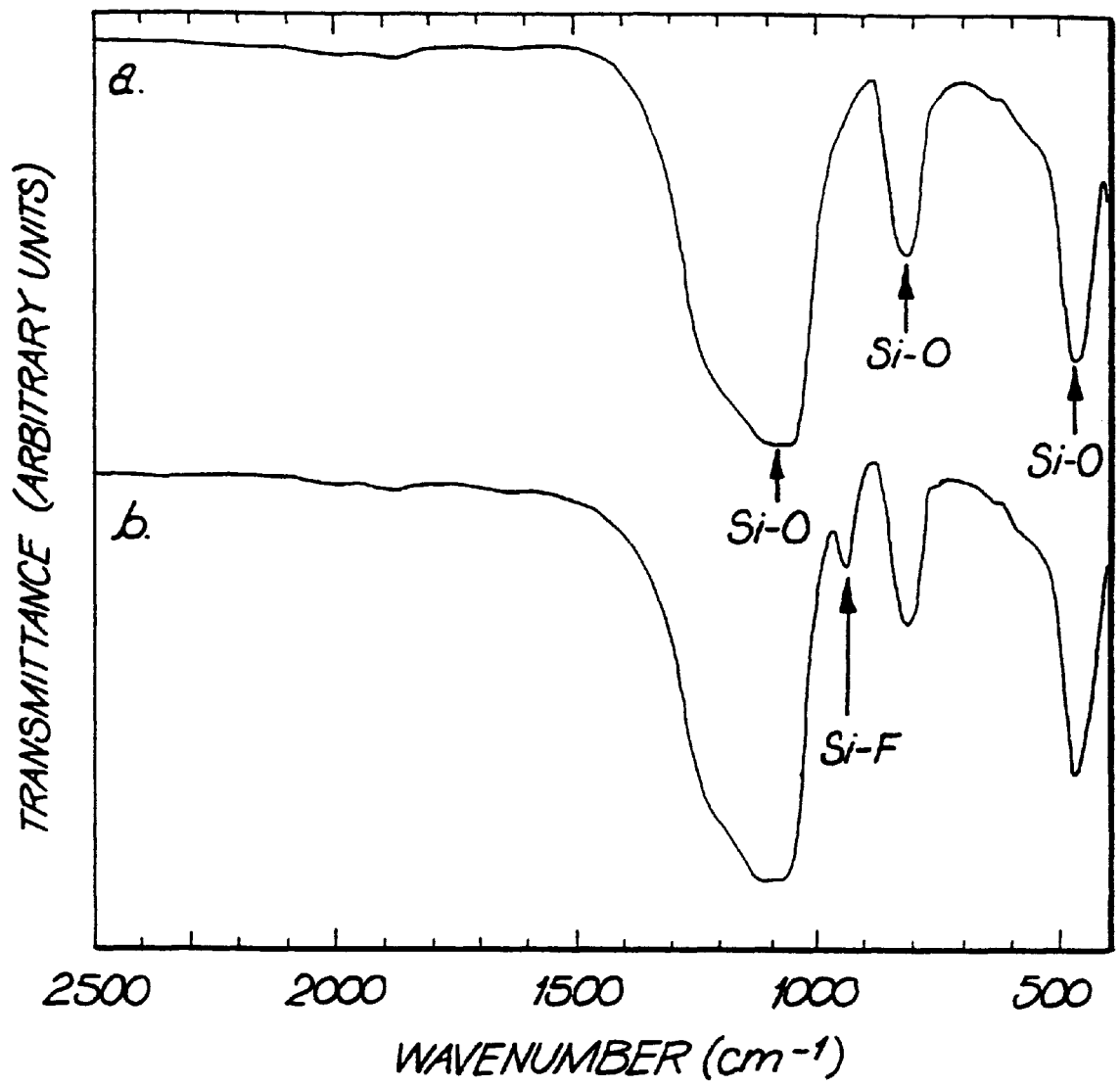
FIG. 3 shows a Fourier Transform Infra-red (FTIR) spectra of a fluorine doped and pure silicon film.

The Fourier Transform Infra red (FTIR) spectra of a fluorine doped and a pure silica film are shown in FIG. 3. The absorption peak at 940 $cm^{-1}$ observed on the resonant frequency of the Si—F bond vibration. This suggests that fluorine replaces oxygen in the silicon oxide tetrahedron and the observed decrease of the refractive index can thus be associated with the low polarisibility of the Si—F bond compared to that of Si—O.

EXAMPLE 1

Using the deposition process described above, a multi-layer waveguide structure was deposited on a silicon wafer substrate, followed by photolithography and reactive ion etching to define the core ridge, and completed with a cladding deposition. No intentional heating of the sample electrode was used during the deposition processes but the wafer was heated by the discharge to a temperature of 250–300° C., as determined by a thermocouple attached to the back of the wafer. The final waveguide consists of 9 $\mu$m thick fluorine doped buffer layer with a refractive index of 1450; a 4.5 $\mu$m square pure silica core with a refractive index of 14.62; and an 8 $\mu$m thick fluorine doped cladding layer with refractive index equal to that of the buffer layer. For comparison, waveguides with similar geometry, but with the core layer deposited from a mixture of silane and nitrous oxide were also fabricated using the same plasma parameters as for the core layer deposition from silane and oxygen.

Figure 4A:
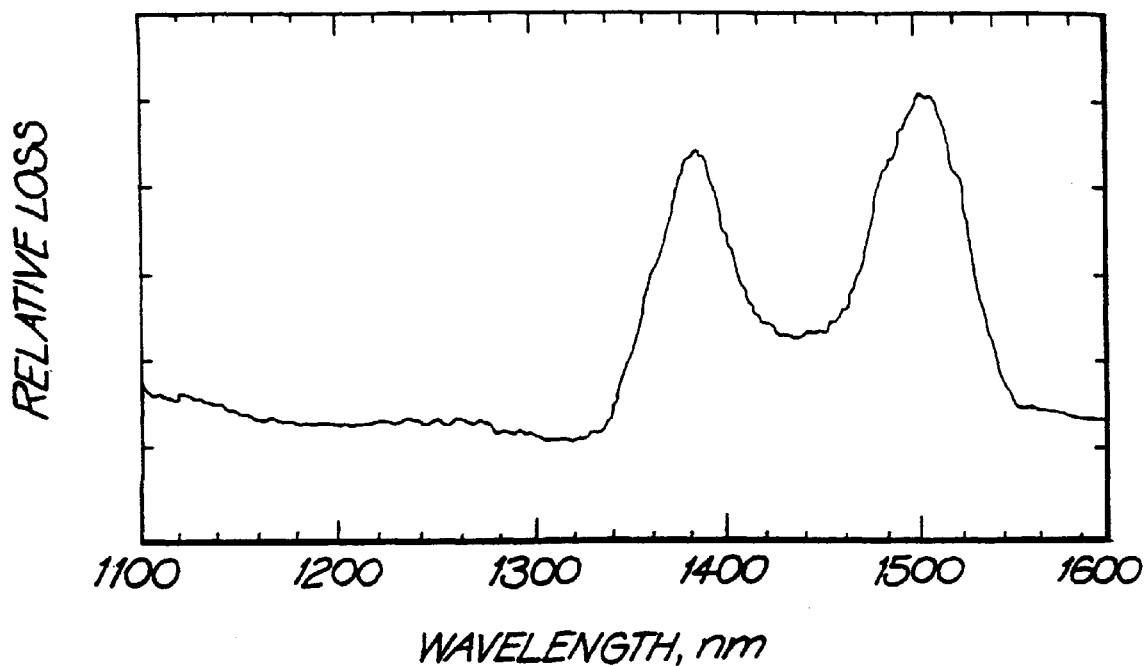
FIG. 4 shows waveguide absorption spectra for waveguides fabricated by PECVD with and without nitrous oxide as an oxidant.
Figure 4B:
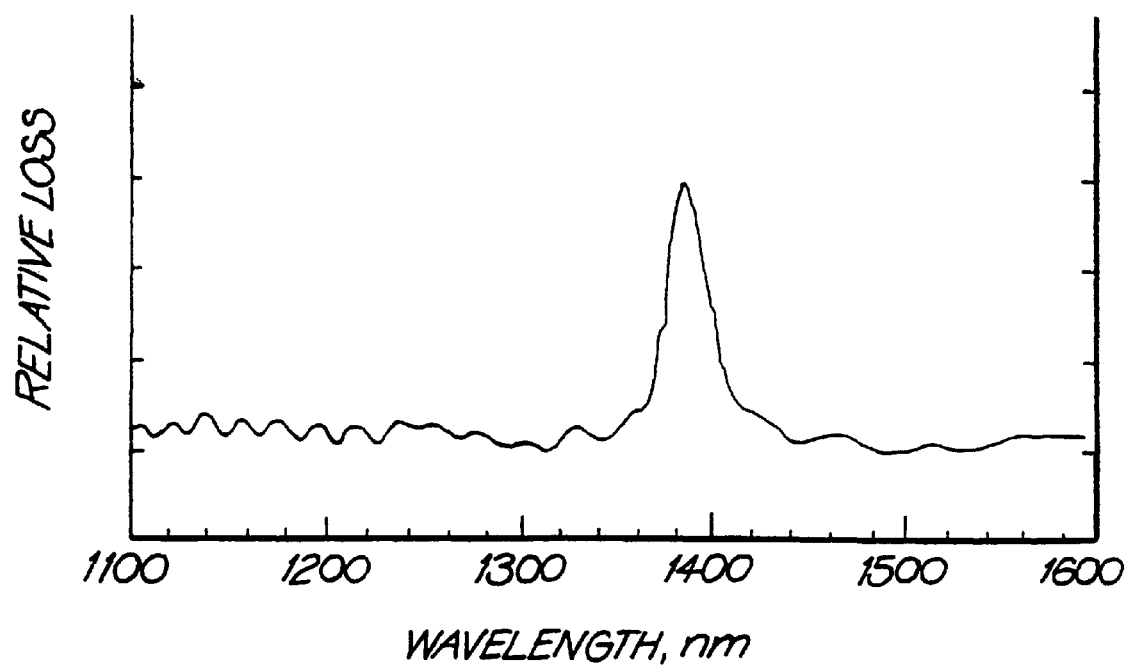

The waveguide loss and absorption spectra were measured by placing the waveguides between two standard single-mode fibres and measuring the transmission characteristics. The waveguide absorption spectra for waveguides fabricated with and without nitrous oxide as an oxidant are shown in FIG. 4. It is seen that the spectrum of the waveguide fabricated using oxygen as an oxidant does not have the absorption peak around 1.5 $\mu$m wavelength seen in the spectrum of the waveguide fabricated using nitrous oxide. This comparison clearly indicates the effect of nitrogen incorporation on the formation of the absorption peak around 1.55 $\mu$m and, therefore, the importance of excluding nitrogen from the deposition process in order to obtain low loss in 1.50–1.55 $\mu$m wavelength range. Outback transmission loss measurements at 1.55 $\mu$m wavelength for the nitrogen free waveguides gave a propagation loss of less than 0.2 dB/cm.

The peak at 1.38 $\mu$m is present on both the fluorine doped and nitrogen doped sample spectra and is due to absorption by O—H bonds.

One of the major applications of a monolithically integrated opto-electronic device would be in the coupling of optical and electronic circuits, i.e., the coupling of laser light from/to an optical circuit, with an opto-electronic transducer arranged to convert light signals into electrical signals or visa versa. As discussed above, the presently available devices attempt to couple a waveguide directly to an opto-electronic transducer. Alignment of the waveguide with the transducer is a significant problem, is very difficult and subject to error and movement over a period of use. The following example discloses a monolithically integrated opto-electronic device which enables coupling of light and electrical signals and which may be fabricated by the novel PECVD process discussed above. The following example proposes for the first time a technology for fabricating an integrated reflector suitable for vertical coupling of light out of the core of a waveguide onto a photo-diode and/or launching light from a surface emitting laser into a waveguide. Vertical coupling has been used previously in aluminium gallium arsenide and gallium arsenide integrated optics, where the light is reflected by total internal reflection from crystallographically etched facets in the semiconductor material. In the case of silica, however, crystallographic etching is not possible and total internal reflection is not practical due to the small refractive index differences involved it a protection layer has to be deposited on a complete opto-electronic circuit.

EXAMPLE 2

Figure 5:
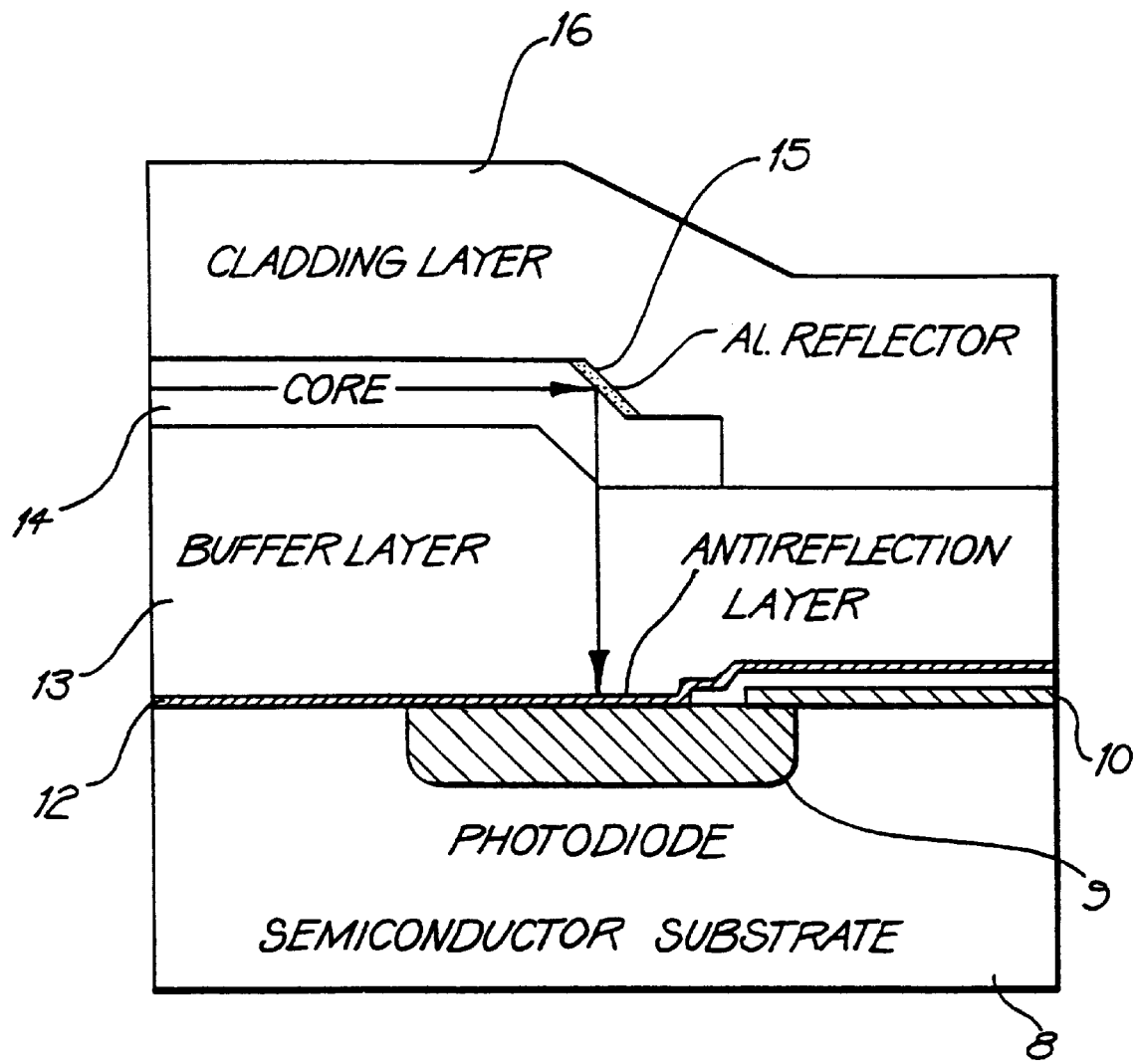
FIG. 5 is a cross-sectional view through a opto-electronic device in accordance with an embodiment of the present invention.

The method described here uses an etching technique to fabricate a 45° facet in the core of a silica-based waveguide, which is then aluminised to obtain the necessary reflectively. Only a few additional steps are required to integrate this with a low-temperature, low-loss PECVD channel waveguide process (as discussed above). An example of the proposed integration of a waveguide and photo-diode with the angled reflector is shown in FIG. 5. Since standard semiconductor fabrication procedures are used throughout, the method has the potential to facilitate cost-effective fabrication of silica-based monolithically integrated opto electronic circuits. The device comprises a silicon semiconductor substrate 8 in which a photo-diode 9, conductive contact 10 and an anti-reflection layer 12 are fabricated using conventional semiconductor fabrication procedures. Subsequently, an optical structure is fabricated in silica on top of the semiconductor substrate. The optical structure comprises a buffer layer 13, a waveguide core 14 for the transmission of light, an aluminised reflector 15 on the waveguide core for directing light and a cladding layer 16.

The proposed fabrication procedure is shown in FIG. 6. The electronic circuit is merely indicated with reference numeral 8 and is not indicated in FIG. 6 in detail. It will be realised, however, that the substrate 8 includes all the components shown in FIG. 5.

Firstly, a silica buffer layer of a thickness sufficient to optically isolate the waveguides 11 from the substrate 8 is deposited using a PECVD process as described above in relation to Example 1, followed by an amorphous silicon (a—Si) layer 17 about 1 $\mu$m thick (also by PECVD).

Prior to depositing the amorphous silicon layer 17, the surface of the buffer layer 17 is subjected to plasma treatment in a plasma processing chamber with a hollow double cathode structure (reference 7), 3 cm electrode spacing and 140 cm electrode diameter, aluminium cathodes coated with two microns of silicon dioxide. The gas used is oxygen, the rf power is 600 W, the pressure is 2 Pa and the time of the plasma treatment is 5 minutes. This creates a superficial layer is etched faster during a subsequent chemical etching step to create a desired profile of a "step" to be formed in the buffer layer (see later).

Figure 6A:
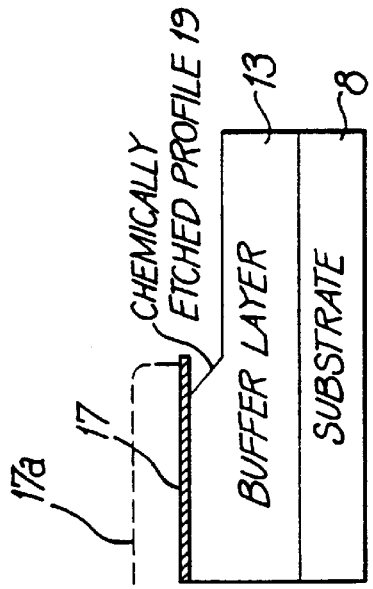
FIGS. 6a to 6h are diagrams illustrating stages in the fabrication of the device of FIG. 5.

Windows are then opened in the amorphous silicon layer 17 at appropriate points above the photo-diodes 9 using standard photolithography and plasma etching (a window is indicated by reference numeral 18 in FIG. 6a).

Figure 6B:
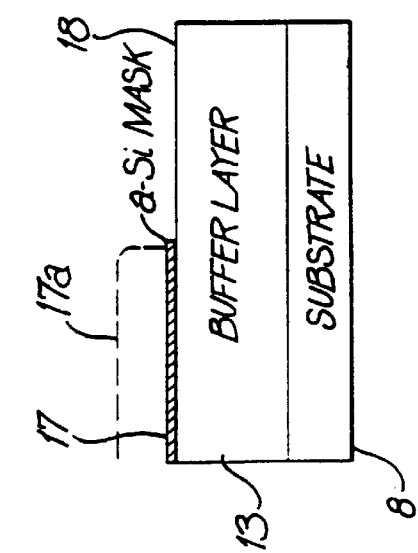

The wafer is then subjected to chemical etching in buffered HF in order to produce a sloped (around 45°) etch profile 19 with a height approximately equal to the thickness of the core layer (FIG. 6b). The a—Si 17 is used as the mask for this step since the adhesion of photoresist is not sufficient to withstand the relatively long chemical etching process. During chemical etching, in a preferred process, the photoresist mask 17a is left on the amorphous silicon to provide further protection against etching in areas where etching is not required.

Figure 7:
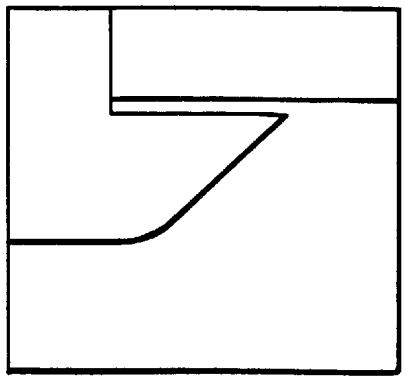
FIG. 7 is a SEM photograph of one stage in the fabrication of the device of FIG. 5.

FIG. 7 shows an SEM photograph of the etched profile 19 with a—Si 17 mask still in place. It can be seen that a straight profile 19 sloped at about 45° is obtained, which differs from the isotropic (rounded) profile more typical of chemical etching. This is because of the previous plasma treatment of the buffer layer surface which creates a superficial layer (approx 100 nm thick) which is etched faster during chemical etching. This effect can be observed in FIG. 7, where the profile is seen to consist of two parts: a lower rounded part which is a typical isotropic profile; and an upper straight part which is the result of the enhanced chemical etching of the superficial layer (not shown) at the silica/a—Si interface.

Figure 6D:
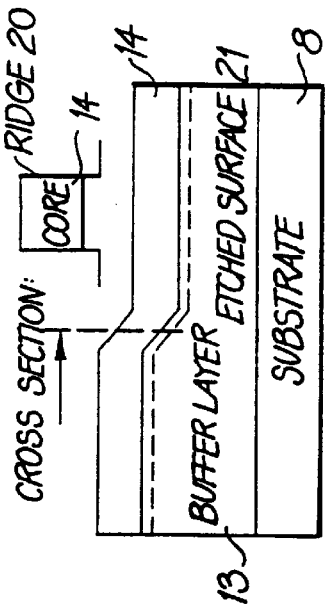
Figure 6C:
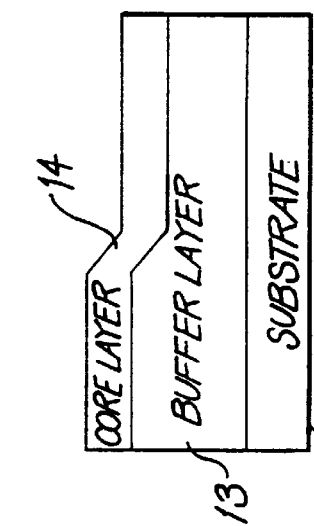
Figure 6F:
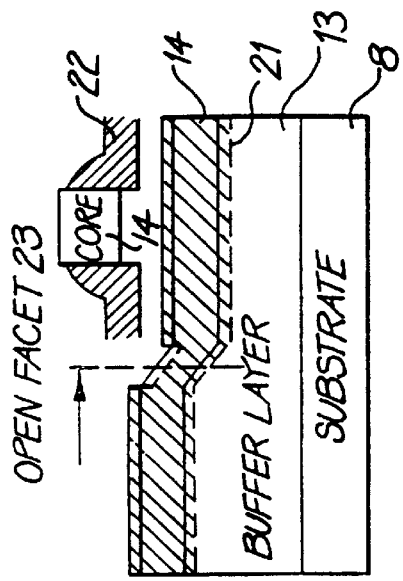

Following chemical etching, the a—Si mask 17 (and any remaining photoresist 17a) is removed and the core layer 14 deposited by PECVD (FIG. 6c). During the core layer deposition it is important to ensure that a sufficient level of ion-bombardment is used in order to maintain the angle of the profile 19 created during the chemical etching of the buffer layer. The conditions for ion-bombardment in the PECVD chamber are as follows:

Gas mixture.
Oxygen plus 15% SiH$_4$.
Pressure. 2 Pa
rf power. 600 W
Self-biased voltage on the cathode (determines the level of ion bombardment (250–300 volts).

The ion-bombardment helps to achieve a uniform redistribution of deposited species thus providing conformal step coverage.

Figure 8A:
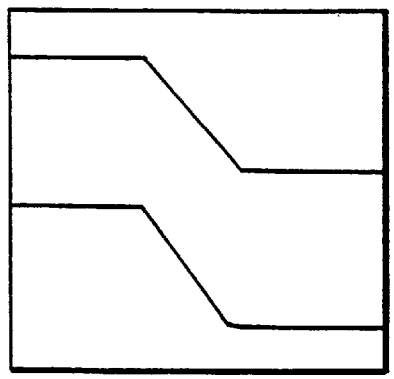
FIGS. 8a and 8b are SEM photographs illustrating another stage in the fabrication process of the device of FIG. 5.
Figure 8B:
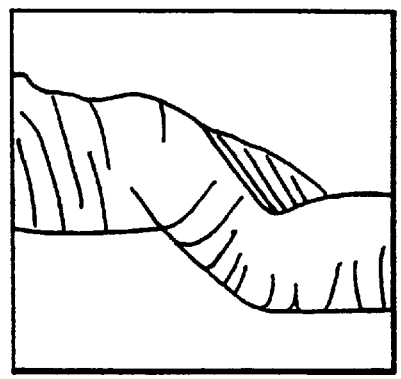

This is illustrated in FIG. 8, where the profiles of layers deposited with and without adequate ion-bombardment of the film surface during PECVD are shown for comparison. The columnar structure of the film in FIG. 8b is also due to an insufficient level of ion-bombardment.

A standard etching technique is now used to define the channel waveguides (FIG. 6d). A waveguide 14 ridge 20 is formed by etching to define the path of the waveguide core 14. The surface of the buffer layer is etched back, as indicated by ghost line 21. A layer of photoresist 22 is then spun on the wafer using conditions which cause the resist to be thinner over the tops of the waveguide core ridges, than elsewhere (FIG. 6e). The conditions for the laying down of the photoresist are as follows:
Photoresist type, AZ 4330 positive photoresist
Sin. 25 SEC at 3000 RPM (rotations per min)
Exposure. 25 SEC's in Quintel Q 404 Mask Aligner (250 W lamp)
Development. MF 319 developer 80 SEC's.

Figure 9A:
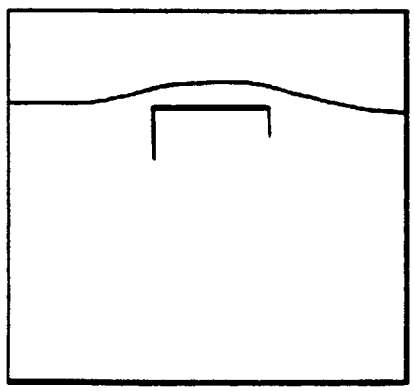
FIGS. 9a and 9b are further SEM photographs illustrating a further stage in the fabrication of the device of FIG. 5.
Figure 9B:
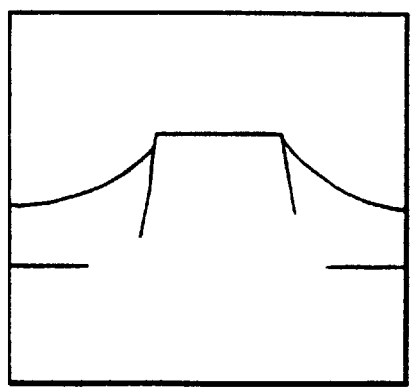

It is possible therefore, to expose and develop the photoresist in such a way that only the top sloped facets 23 of the core 14 are opened (FIG. 2f). SEM photographs of the as-spun photoresist covering a waveguide core ridge, and the same photoresist after development, are shown in FIGS. 9a and 9b, respectively.

Figure 6H:
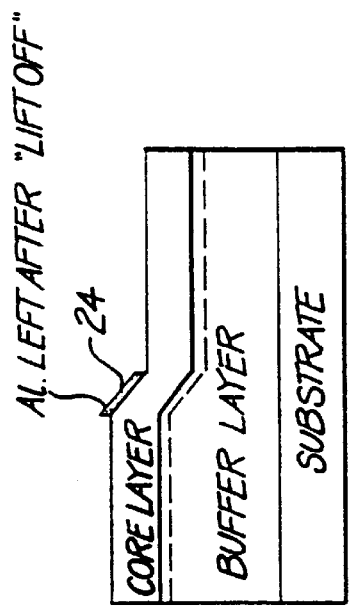
Figure 6E:
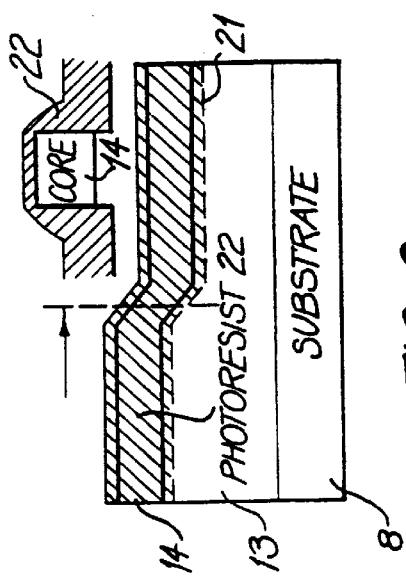
Figure 6G:
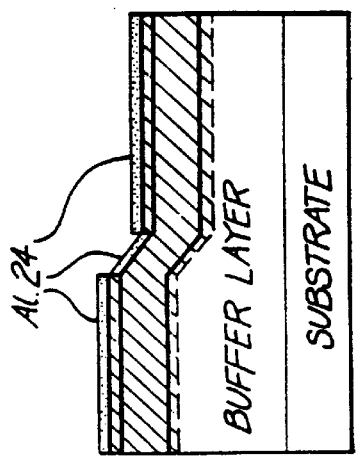

The core facets 23 are now aluminised 24 by evaporation (FIG. 6g), followed by conventional "lift-off" of the aluminium deposited on the photoresist (FIG. 6h). The final structure is then capped with an appropriate waveguide cladding layer (using PECVD) 16.

The fabrication procedure results in the device shown in FIG. 5 which can be utilised to couple optics and electronics.

Figure 10A:
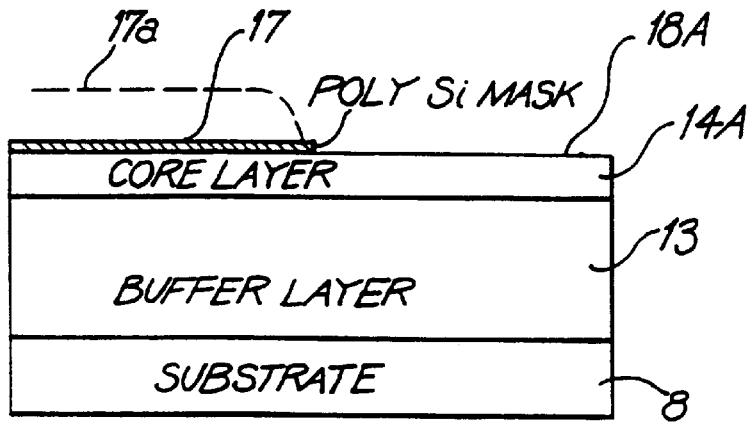
FIGS. 10a to 10c are diagrams illustrating alternative process steps for fabricating the device of FIG. 5.
Figure 10B:
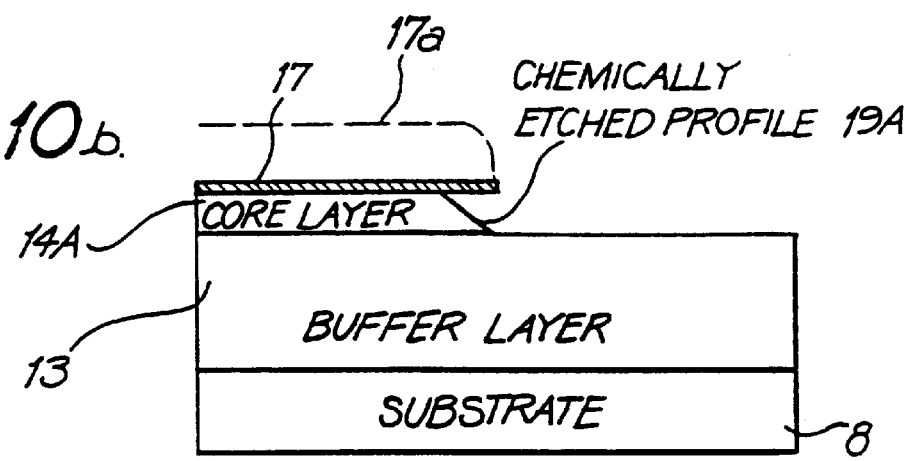
Figure 10C:
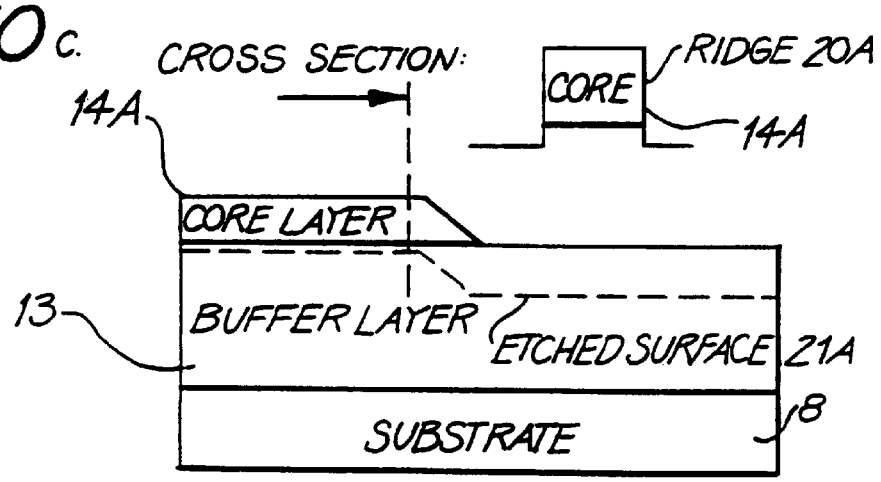

An alternative, presently preferred method of forming the step in the waveguide core will now be explained with reference to FIG. 10. Similar reference numerals are used for the same components as designated in FIG. 6.

Instead of the step being formed in the buffer layer 13 and the core layer subsequently being deposited so that the profile of the core layer conforms to the stepped profile of the buffer layer, the core layer is actually formed with the step in it. The steps in this alternative are as follows. After a buffer layer 13 has been deposited, a core layer 14a is deposited on the buffer layer (FIG. 10a) and a amorphous silicon mask 17 is deposited on top of the core layer. Windows 18A are opened in the amorphous silicon mask by using standard photolithography at appropriate points above the photo-diodes 9 (see FIG. 5).

Prior to depositing the amorphous silicon mask, the surface of the core layer 18A is subjected to plasma treatment to create a superficial layer which will be etched faster by chemical etching (as previous method, above).

The core layer is then chemically etched (FIG. 10b) to produce a chemically etched step profile 19A (photoresist 17a is preferably left on the surface of the amorphous silicon to protect against unwanted etching). As before, because of the superficial layer, the chemically etched profile is created as desired. The same standard etching techniques as that mentioned above is then used to define the channel waveguides. This gives an etched surface 21A in the buffer layer. Following steps are those described above with reference to FIG. 6e and onwards.

It will be appreciate that the general process disclosed herein can be utilised to fabricate any integrated combination of optical and electronic circuits incorporating any type of electrical and optical components. The process disclosed herein can also be used to manufacture optical components on their own, as discussed in the preamble.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

We claim:

1. A method of fabricating an optical device on a substrate, comprising the step of forming an optical component by plasma enhanced chemical vapour deposition (PECVD) onto the substrate, the PECVD being carried out in the absence of nitrogen and nitrogen containing source materials.

2. A method in accordance with claim 1, oxygen being used in the PECVD process as an oxidant for silane to form deposited silica.

3. A method in accordance with claim 1, fluorine being used in the PECVD process as dopant to vary the refractive index of deposited silica.

4. A method in accordance with claim 3, wherein carbon tetrafluoride is employed in the PECVD process as the source material for fluorine dopant.

5. A method in accordance with claim 1, the PECVD process being carried out in a high plasma density hollow cathode deposition system comprising two opposing rf powered electrodes which operate to produce a high density plasma between them due to an "electron mirror" effect.

6. A method in accordance with claim 5, oxygen being used as the oxidant for silicon, and the pressure in the chamber being sufficiently low to suppress spontaneous reaction between silane and oxygen.

7. An integrated opto-electronic device, comprising a multilayer silica structure fabricated on a semiconductor substrate, the silica structure incorporating a waveguide defining a light path and a reflector within the light path for steering light to or from an electro-optic transducer fabricated in the semiconductor substrate.

8. A device in accordance with claim 7, the waveguide being fabricated spaced from the semiconductor substrate and running substantially parallel thereto, the reflector being formed at an angle in a step in the waveguide to direct light travelling in the waveguide out of the waveguide, through the silica to or from the semiconductor substrate, to couple light in the light path to/from the electro-optic transducer.

9. A device in accordance with claim 8, the reflector being arranged such that the angle of incidence of light travelling within the light path to the reflector is 45°.

10. A device in accordance with claim 7, wherein the reflector is constructed by depositing a layer of aluminium onto the waveguide.

11. A device in accordance with claim 7, fabricated utilising the method of fabricating an integrated optoelectronic arrangement, comprising an optical component fabricated in silica and an electronic component fabricated in a semiconductor substrate the method comprising the step of forming the optical component by plasma enhanced chemical vapour deposition (PECVD) onto the semiconductor substrate.

12. A method of fabricating an integrated opto-electronic device, comprising a multilayer silica structure fabricated on a semiconductor substrate, the silica structure comprising a waveguide defining a light path and a reflector within the light path for steering light to or from an electro optic transducer fabricated in the semiconductor substrate, the method comprising the steps of, forming a waveguide core in a multilayer silica structure on a semiconductor substrate, forming an angled step in the waveguide core, and treating a surface of the step to form a reflector for steering light to the electro-optic transducer in the semiconductor substrate.

13. A method in accordance with claim 12, wherein the step of forming a step in the waveguide core, comprises the steps of forming a step in a deposited silica buffer layer and subsequently depositing and forming a core layer on the stepped buffer layer.

14. A method in accordance with claim 13, wherein the step of forming the step in the buffer layer comprises plasma treating the surface of the buffer layer to create a superficial layer, depositing an amorphous silicon mask on the superficial layer, opening a window in the amorphous silicon mask, and chemically etching the buffer layer at the window to provide a chemically etched stepped profile, whereby the superficial layer is etched faster during the chemical etching step whereby to create a desired stepped profile.

15. A method in accordance with claim 13, wherein the step of depositing and forming the core layer on the stepped buffer layer, comprises depositing the core layer using a sufficient level of ion bombardment to maintain the angle of the stepped profile of the buffer layer.

16. A method in accordance with claim 12, wherein the step of forming the angled step in the waveguide core, comprises forming a waveguide core layer, plasma treating the surface of the first waveguide core layer to create a superficial layer, depositing an amorphous silicon mask on the superficial layer, opening a window in the amorphous silicon mask, and chemically etching the core layer at the window to provide a stepped profile.

17. A method in accordance with claim 1, wherein the substrate is a semiconductor substrate within which an electronic component has been fabricated, whereby the method results in the fabrication of an integrated opto-electronic arrangement.

* * * * *